United States Patent
Kim et al.

(10) Patent No.: US 11,450,551 B2
(45) Date of Patent: Sep. 20, 2022

(54) EDGE RING AND HEAT TREATMENT APPARATUS HAVING THE SAME

(71) Applicant: AP SYSTEMS INC., Hwaseong-Si (KR)

(72) Inventors: Chang Kyo Kim, Hwaseong-Si (KR); Chang Min Kwon, Hwaseong-Si (KR)

(73) Assignee: AP SYSTEMS INC.

( * ) Notice: Subject to any disclaimer, the term of this patent is extended or adjusted under 35 U.S.C. 154(b) by 14 days.

(21) Appl. No.: 16/989,864

(22) Filed: Aug. 10, 2020

(65) Prior Publication Data
US 2021/0082737 A1   Mar. 18, 2021

(30) Foreign Application Priority Data
Sep. 16, 2019   (KR) .......................... 10-2019-0113482

(51) Int. Cl.
*H01L 21/687* (2006.01)
*H01L 21/67* (2006.01)
*C23C 16/458* (2006.01)

(52) U.S. Cl.
CPC .... *H01L 21/68721* (2013.01); *C23C 16/4586* (2013.01); *H01L 21/67017* (2013.01); *H01L 21/67103* (2013.01)

(58) Field of Classification Search
None
See application file for complete search history.

(56) References Cited

U.S. PATENT DOCUMENTS

| 6,264,467 B1 * | 7/2001 | Lue | ..................... C23C 16/4581 |
| | | | 211/41.18 |
| 6,888,104 B1 * | 5/2005 | Ranish | ................ F27B 17/0025 |
| | | | 118/50.1 |
| 8,455,374 B2 * | 6/2013 | Hanawa | ............ H01L 21/67115 |
| | | | 438/790 |
| 8,741,099 B2 * | 6/2014 | Higashijima | ....... H01L 21/6708 |
| | | | 156/345.55 |
| 9,076,828 B2 * | 7/2015 | Koelmel | ........... H01L 21/67115 |

(Continued)

FOREIGN PATENT DOCUMENTS

| JP | 560173852 A | 9/1985 |
| JP | H113884 A | 1/1999 |

(Continued)

OTHER PUBLICATIONS

Machine Generated English Translation of the Bib data of JP2003-249458 Published Sep. 5, 2003. (Year: 2003).*

(Continued)

*Primary Examiner* — Sylvia MacArthur
(74) *Attorney, Agent, or Firm* — Renaissance IP Law Group LLP

(57) ABSTRACT

Provided are an edge ring and a heat treatment apparatus having the same. The edge ring includes a main body having a ring shape. The main body includes a substrate support part configured to support an edge of a bottom surface of a substrate, an outer band provided outside the substrate support part and having a top surface that is higher than a top surface of the substrate support part and is parallel to a top surface of the substrate supported by the substrate support part, an outer sidewall provided outside the outer band, and a groove part provided between the substrate support part and the outer band.

7 Claims, 4 Drawing Sheets

(56) References Cited

U.S. PATENT DOCUMENTS

2012/0244703 A1* 9/2012 Nakayama .......... C23C 16/4585
                       438/680
2021/0082737 A1* 3/2021 Kim .................. H01L 21/67248

FOREIGN PATENT DOCUMENTS

| | | |
|---|---|---|
| JP | 2000058470 A | 2/2000 |
| JP | 2002503884 A | 2/2002 |
| JP | 2002510151 A | 4/2002 |
| JP | 2003249458 A * | 9/2003 |
| JP | 2003249458 A | 9/2003 |
| JP | 2005340488 A | 12/2005 |
| JP | 2007523466 A | 8/2007 |
| JP | 2007294942 A | 11/2007 |
| JP | 2008166706 A | 7/2008 |
| KR | 20000023850 A | 4/2000 |
| KR | 20050017782 A | 2/2005 |
| KR | 20140008389 A | 1/2014 |
| KR | 20150067377 A | 6/2015 |
| KR | 20150074073 A | 7/2015 |

OTHER PUBLICATIONS

Machine Generated English Translation of the Description of JP2003-249458 Published Sep. 5, 2003. (Year: 2003).*
Machine Generated English Translation of the claims of JP2003-249458 Published Sep. 5, 2003. (Year: 2003).*

* cited by examiner (a)

(b)

(c)

EDGE RING AND HEAT TREATMENT APPARATUS HAVING THE SAME

CROSS-REFERENCE TO RELATED APPLICATION

This application claims priority to Korean Patent Application No. 10-2019-0113482 filed on Sep. 16, 2019, and all the benefits accruing therefrom under 35 U.S.C. § 119, the contents of which are incorporated by reference in their entirety.

BACKGROUND

The present disclosure relates to an edge ring and a heat treatment apparatus having the same, and more particularly, to an edge ring, which improves temperature uniformity of a substrate during heat treatment, and a heat treatment apparatus having the same.

When a substrate is treated in a heat treatment process, the substrate contacts an edge ring within a chamber and thus is supported by the edge ring. Then, a top surface of the substrate is heated using a heating source disposed above the substrate, and after the heating is completed, the substrate is cooled. Here, the edge ring directly contacts the substrate so as to be heat-exchanged with the substrate during the heating and cooling, thereby being sensitively changed in temperature in accordance with a change in ambient temperature. An edge region of the substrate supported by the edge ring may be adjacent to a gas supply that supplies a process gas to react with the process gas that is relatively less heated than a central region of the substrate in accordance with a flow of the process gas in one direction (for example, in a single plane direction) as well as to cause a temperature deviation between the substrate and the edge ring, thereby causing temperature non-uniformity between the central region of the edge region of the substrate and difficulty in securing temperature uniformity of the substrate. The temperature non-uniformity may be more serious in rapid thermal processing (RTP) of the substrate.

Particularly, in the case of a process substrate having a micro device structure, a temperature non-uniformity may occur between micro devices, and thus, quality may be changed in accordance with the micro devices to deteriorate reliability of a product.

Also, when the temperature deviation between the center region and the edge region of the substrate is severe, twisting and/or warpage of the substrate may occur, a focusing error may occur, and yield may be deteriorated.

PRIOR ART DOCUMENT

Patent Document

Korean Patent Publication No. 10-2005-0017782

SUMMARY

The present disclosure provides an edge ring supporting a substrate with improved temperature uniformity during heat treatment and a heat treatment apparatus having the same.

In accordance with an exemplary embodiment, an edge ring include: a main body having a ring shape, wherein the main body includes: a substrate support part configured to support an edge of a bottom surface of a substrate; an outer band provided outside the substrate support part, and having a top surface that is higher than a top surface of the substrate support part and is parallel to a top surface of the substrate supported by the substrate support part; an outer sidewall provided outside the outer band; and a groove part provided between the substrate support part and the outer band.

The groove part may include: a bottom plate provided at a height that is lower than the outer band; an inner sidewall protruding from a top surface of the bottom plate; and a connection sidewall configured to connect the outer band to the bottom plate.

The connection sidewall may have an inner surface configured to connect the top surface of the outer band to the top surface of the bottom plate, and the inner surface may at least partially have a section in which the inner surface approaches the inner sidewall as a height of the inner surface is lowered.

An upper end of the inner sidewall may have the same height as the top surface of the substrate supported by the substrate support part or have a height higher than the top surface of the substrate.

The bottom plate may be provided at a height that is less than that of the top surface of the substrate supported by the substrate support part.

The edge ring may further include a coating layer made of oxide of any one of elements constituting the main body and coated on at least a portion of the main body.

The coating layer may have a thickness that is selected in a range of 400 nm to 1,500 nm.

In accordance with another exemplary embodiment, a heat treatment apparatus includes: a chamber having an inner space in which a heat treatment process is performed; an edge ring in accordance with an exemplary embodiment, which is provided in the inner space of the chamber; a heating source disposed above the edge ring to provide heat energy toward the substrate supported by the edge ring; a gas supply part provided at one side of the chamber to supply a process gas; and an exhaust part provided at the other side of the chamber to face the gas supply part, thereby exhausting a remaining gas within the chamber.

The heating source may have an area greater than that of the substrate, and at least a portion of the heating source may be provided above the groove part of the edge ring to provide heat energy toward the groove part.

The heat treatment apparatus may further include a rotation support part rotating the edge ring, and the rotation support part may include a support ring on which the edge ring is supported.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
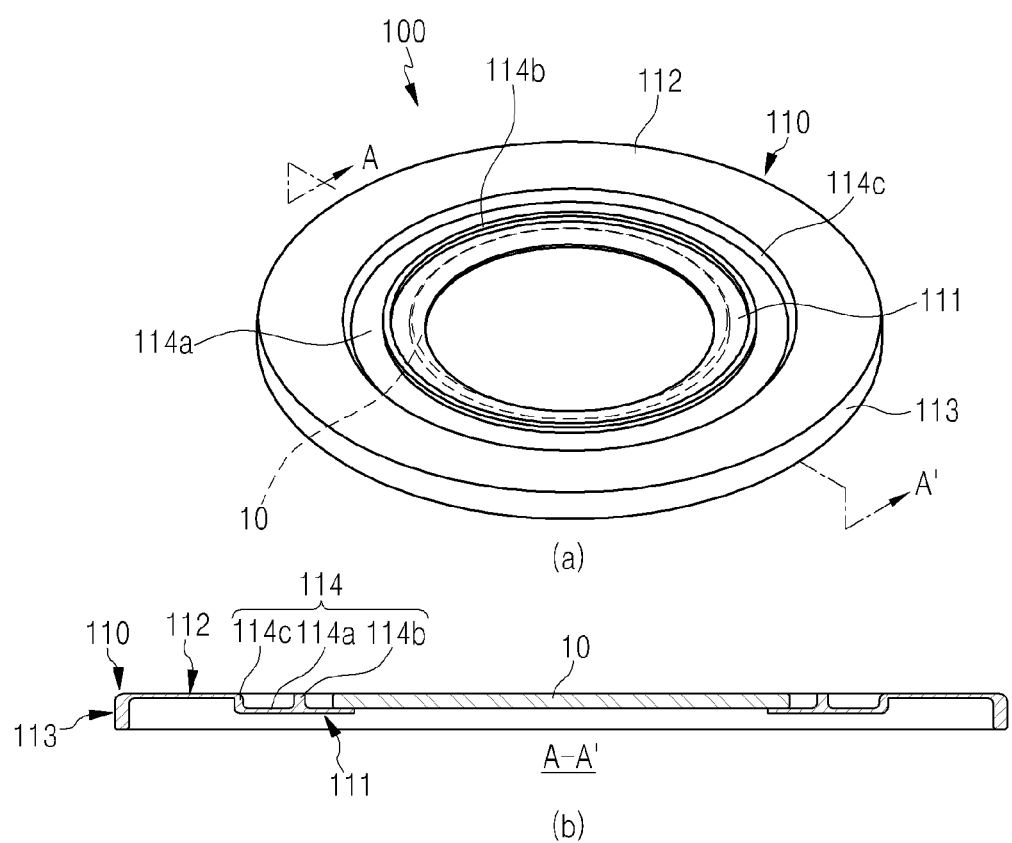
FIG. 1 is a view illustrating an edge ring in accordance with an exemplary embodiment.

Hereinafter, specific embodiments will be described in more detail with reference to the accompanying drawings.

The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. In the descriptions, the same elements are denoted with the same reference numerals. In the figures, the dimensions of layers and regions are exaggerated for clarity of illustration. Like reference numerals refer to like elements throughout.

FIG. 1 is a view illustrating an edge ring in accordance with an exemplary embodiment. Here, (a) of FIG. 1 is a perspective view of the edge ring, and (b) of FIG. 1 is a cross-sectional view of the edge ring, taken along line A-A'.

Referring to FIG. 1, an edge ring in accordance with an exemplary embodiment may include a main body 110 having a ring shape. The main body 110 may include a substrate support part 111 supporting an edge of a bottom surface of a substrate 10, an outer band 112 provided outside the substrate support part 111, and having a top surface that is higher than a top surface of the substrate support part 111 and parallel to a top surface of the substrate 10 supported by the substrate support part 111, an outer sidewall 113 provided outside the outer band 112, and a groove part 114 provided between the substrate support part 111 and the outer band 112.

The edge ring 100 in accordance with an exemplary embodiment may be an edge ring 100 used in a rapid thermal processing (RTP) device that heats the substrate 10 by using radiant energy using light.

The main body 100 may have the ring shape and be configured to support the edge of the bottom surface of the substrate 10. The main body may include the substrate support part 111, the outer band 112, the outer sidewall 113, and the groove part 114.

The substrate support part 111 may support the edge of the bottom surface of the substrate 10 and be disposed at the innermost side of the main body 110. Here, the substrate support part 111 may provide a support surface, on which the substrate 10 is stably supported, and be provided as a plate 111a having a ring shape. The substrate 10 may be supported on a support tip protruding from a top surface of the plate 111a.

The outer band 112 may be provided outside the substrate support part 111, and have the top surface that is higher than the top surface of the substrate support part 111 and is parallel to the top surface of the substrate 10 supported on substrate support part 111. Here, when the substrate support part 111 has a support tip 111b, an upper end surface of the support tip 111b may be the top surface of the substrate support part 111. The outer band 112 may be disposed outside the substrate support part 111 to induce a flow of a process gas. The outer band 112 may have a top surface parallel to the top surface of the substrate 10 supported on the substrate support part 111 to form a flow of the process gas, which is parallel to the top surface of the substrate 10. Here, the top surface of the top surface of the outer band 112 may have the same height as the top surface of the substrate and induce the process gas along the top surface of the outer band 112 to the top surface of the substrate 10 by a gas supply part 230 and an exhaust part 240, which are opposite to each other, thereby forming a laminar flow on the substrate 10.

The outer band 113 may be provided outside the outer band 112 to induce an alignment of the edge ring 100 when the edge ring 100 is supported on a support ring 251 of a rotation support ring 250 and prevent the edge ring 100 from moving (or being shaken) in a left and right direction (or in a horizontal direction). For example, the outer sidewall 113 may extend downward from the outer band 112 to serve as a sidewall cover covering a sidewall of the support ring 251 and prevent the edge ring 100 from moving in the left and right direction by hooking the outer sidewall 113 on the sidewall of the support ring 251.

The groove part 114 may be provided between the substrate support part 111 and the outer band 112 to define a space that is lower than the top surface of the outer band 112 and the top surface of the substrate 10. The groove part 114 may have a groove shape with a bottom surface and both sidewalls. The process gas moving along the top surface (or the surface) of the outer band 112 may be introduced into the groove part 114 and then be sufficiently heated. Then, the heated process gas that is heated due to the ascending of the process gas heated by convection and the continuous introduction of the process gas may be discharged from the groove part 114 to flow along the top surface of the substrate 10.

As a result, the process gas may be supplied to the substrate 10 after being sufficiently heated. Thus, the edge of the substrate 10 may be prevented from decreasing in temperature due to the process gas. Accordingly, a temperature deviation between the central region and the edge region of the substrate 10 may be minimized to improve temperature uniformity of the substrate 10.

The groove part 114 may include a bottom plate 114a provided at a height lower than the outer band 112, an inner sidewall 114b protruding from a top surface of the bottom plate 114a, and a connection sidewall 114c connecting the outer band 112 to the bottom plate 114a. The bottom plate 114a may be provided at a height lower than the outer band 112 to provide a bottom surface of the groove part 114, and the top surface of the bottom plate may be disposed lower than each of the top surface of the outer band 112 and the top surface of the substrate 10.

The inner sidewall 114b may protrude from the top surface of the bottom plate 114a and be provided between the bottom plate 114a and the substrate support part 111 to distinguish the groove part 114 from the substrate support part 111 and define a groove (or an inner space) together with the bottom plate 114a and the connection sidewall 114c. Here, the inner sidewall 114b may be provided to face the connection sidewall 114c. For example, the inner sidewall 114b may have a rib shape that protrudes from the bottom plate 114a so that only a lower end thereof is connected.

The connection sidewall 114c may be provided between the outer band 112 and the bottom plate 114a to connect the outer band 112 to the bottom plate 114a and provide a sidewall by a height difference between the outer band 112 and the bottom plate 114a. Here, the connection sidewall 114c may be provided to face the outer sidewall 113 as well as the inner sidewall 114b and may wrap the support ring 251 together with the outer sidewall 113 and the outer band 112. As a result, at least a portion of the support ring 251 may be inserted (fitted) into a space defined by the outer sidewall 113, the outer band 112, and the connection sidewall 114c so that the edge ring 100 is supported by the support ring 251 of the rotation support part 250.

Figure 2:
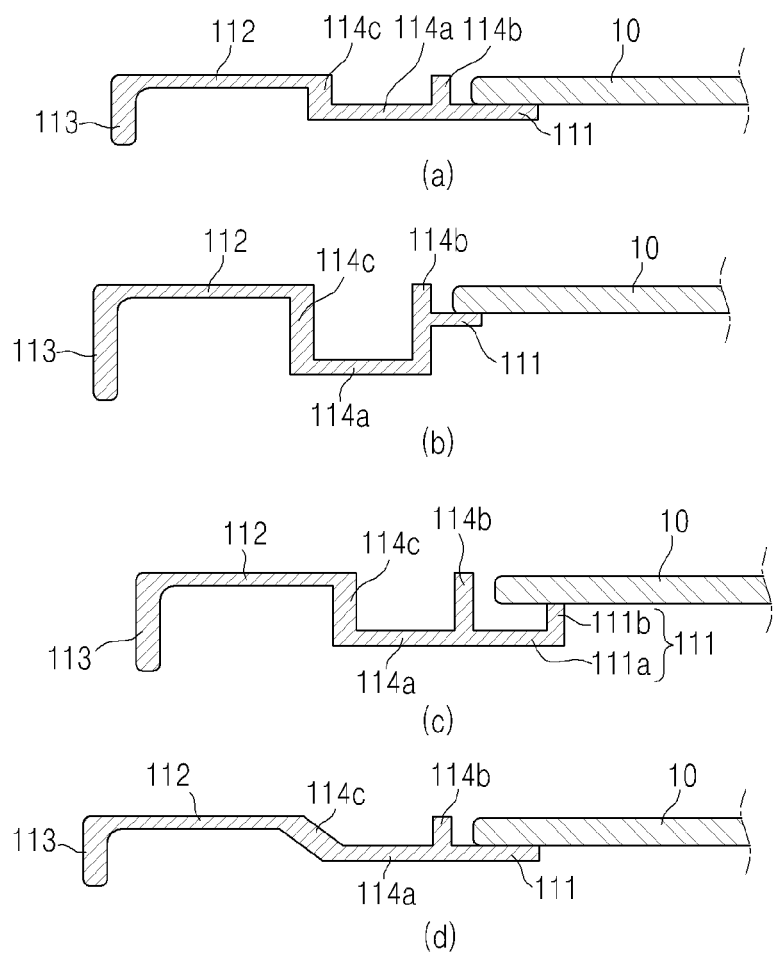
FIG. 2 is a view illustrating a modified example of the edge ring in accordance with an exemplary embodiment.

FIG. 2 is a view illustrating a modified example of the edge ring in accordance with an exemplary embodiment. Here, (a) of FIG. 2 illustrates an example of the edge ring, (b) of FIG. 2 illustrates an edge ring in which the bottom plate is disposed lower than the substrate support part, (c) of FIG. 2 illustrates an edge ring in which the substrate support part includes a support tip, and (d) of FIG. 2 illustrates an edge ring in which an inner sidewall is inclined.

Referring to FIG. 2, the connection sidewall 114c may have an inner surface connecting a top surface of the outer band 112 to a top surface of the bottom plate 114a, and the inner surface may at least partially have (or include) a section that approaches the inner sidewall 114b as the inner surface decreases in height. For example, the inner surface of the connection sidewall 114c may be inclined or rounded so that a height difference between the top surface 112 of the outer band and the inner surface increases as the inner surface approaches the inner sidewall 114b. That is, the inner surface of the connection sidewall 114c may be inclined downward toward the inside (or the inner sidewall) of the main body 110 as illustrated in (d) of FIG. 2 or may be rounded to gradually decrease in inclination of the inner surface of the connection sidewall 114c from the top surface of the outer band 112 to the top surface of the bottom plate 114a. Here, the connection sidewall 114c may be inclined or rounded as a whole (that is, all of the inner surface and the outer surface of the connection sidewall), or only the inner surface of the connection sidewall 114c may be inclined or rounded. Alternatively, the inner surface of the connection sidewall 114c may be inclined or rounded as a whole or may be partially inclined or rounded.

In this case, a process gas may be stably induced to an inner space (or a groove) of the groove part 114 along the inner surface of the connection sidewall 114c, the inner space of the groove part 114 may increase in volume, and the process gas may be effectively heated in the inner space of the groove part 114. When the connection sidewall 114c is vertically disposed (or has a right angle), the process gas may be introduced into the inner space of the groove part 114 by only a difference in air pressure between the inner space and an outer space of the groove part 114. Here, when the process gas is filled into the inner space of the groove part 114 to decrease in difference in air pressure between the inner space and the outer space of the groove part 114, the process gas may not be properly introduced into the inner space of the groove part 114 and thus may not be sufficiently heated and then flow to the substrate 10. However, when the inner surface of the connection sidewall 114c is inclined or rounded in the same shape as described above, the process gas may be induced along the inner surface of the connection sidewall 114c as well as the difference in air pressure between the inner space and the outer space of the groove part 114 and thus be effectively introduced into the inner space of the groove part 114 and also be sufficiently heated in the inner space of the groove part 114. Thus, it is possible to effectively prevent a temperature of an edge region of the substrate 10 from being relatively lowered by the process gas that is not sufficiently heated.

An upper end of the inner sidewall 114b may have a height that is equal to or higher than a top surface of the substrate 10 supported by the substrate support part 111. When the upper end of the inner sidewall 114b is lower than the top surface of the substrate supported by the substrate support part 111, at least a portion of the process gas may not be blocked by the inner sidewall 114b and thus may not be introduced into the inner space of the groove part 114 in spite of descending current due to the groove part 114, and thus, a portion of the process gas may directly flow to the top surface of the substrate 10. As a result, a temperature of the edge region of the substrate 10 may be relatively lowered due to the process gas that is not sufficiently heated due to the direct flow to the top surface of the substrate 10.

However, in this embodiment, when the upper end of the inner sidewall 114b has the same height as the top surface of the substrate 10 supported by the substrate support part 111 or is higher than the top surface of the substrate 10, the process gas may be blocked by the descending current due to the groove part 114 before flowing to the top surface of the substrate 10. As a result, the process gas may not be sufficiently heated and prevented from flowing to the top surface of the substrate 10. Therefore, it is possible to prevent the temperature of the edge region of the substrate 10 from being relatively lowered due to the supply of the process gas that is not sufficiently heated.

Here, the top surface of the outer band 112 may be disposed at the same height as the top surface of the substrate 10, and the upper end of the inner sidewall 114b may be disposed at the same height as the top surface of the substrate 10. In this case, the process gas may be blocked by the inner sidewall 114b by the descending current due to the groove part 114, as well as, a supply hole of the gas supply part 230 and a discharge hole of the exhaust part 240 may face each other along the top surface (i.e., the top surface of the outer band, the upper end of the inner sidewall, and the top surface of the substrate) of the substrate 10 to effectively generate a laminar flow on the substrate 10.

The bottom plate 114a may be provided at a height lower than the top surface of the substrate 10 supported by the substrate support 111. That is, the process may be heated in a space defined at a height lower than the top surface of the substrate 10 and then flow over the inner sidewall 114b to flow along the top surface of the substrate 10. Thus, the process gas may well react on the substrate 10. When the bottom plate 114a is disposed at the same height as the top surface of the substrate 10 or disposed higher than the top surface of the substrate 10, the process gas may be heated in the space defined higher than the top surface of the substrate 10, and it may be difficult to allow the process gas moving to a higher position along the inner sidewall 114b to flow along the top surface of the substrate 10. As a result, the process gas may not effectively react on the substrate 10. Thus, the bottom plate 114a may be provided lower than the top surface of the substrate 10 supported by the substrate support part 111 so that the process gas flowing over the inner sidewall 114b after being heated flows along the top surface of the substrate 10 to effectively reacts on the substrate 10.

The bottom plate 114a may be provided lower than the substrate support part 111 supporting the substrate 10, the inner space of the groove part 114 may increase in volume, and the main body of the edge ring 100 may increase in surface area. When the inner space of the groove part 114 increases in volume, a large amount of process gas may be effectively heated, and when the main body 110 increases in surface area, a ratio of an exposed surface area and a mass of the edge ring 100 may increase to reduce a radial temperature gradient during the heating. In addition, when the surface area of the main body 110 increases, an azimuth thermal conductivity of the edge ring 100 may be improved by the added mass due to the increase in surface area. In the edge ring 100 in accordance with an exemplary embodiment, the edge ring 100 may be reduced in azimuth and radial deformation, and uniformity of heat exchange between the edge ring 100 and the substrate 10 may be improved to improve heat treatment uniformity.

Figure 3:
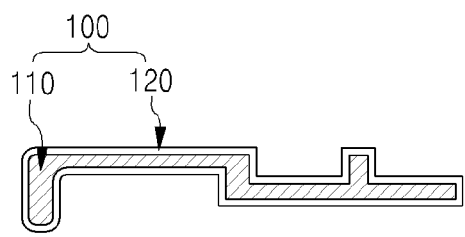
FIG. 3 is a view illustrating an edge ring including a coating layer in accordance with an exemplary embodiment.

FIG. 3 is a view illustrating the edge ring including a coating layer in accordance with an exemplary embodiment.

Referring to FIG. 3, the edge ring 100 in accordance with an exemplary embodiment may further include a coating layer 120 made of oxide of any one of elements constituting the main body 110 and coated on at least a portion of the main body 110.

The coating layer 120 may be coated (or applied) on at least a portion of the main body 110 and may be made of oxide of any one of the elements constituting the main body 110. For example, the coating layer 120 may be formed by a wet and/or dry method after being subjected to a cleaning process of the processed main body 110 or may be formed on the entire surface or a portion of the main body 110. As a result, a specific region of the main body 110 may increase or decrease in thickness.

In an exemplary embodiment, the coating layer 120 may be coated on at least a portion of the main body 110 so that the edge ring 100 increases in mechanical stiffness and thermal conductivity, reduce thermal deformation and chemical damage (damage), contamination It can have strong resistance to and particles.

For example, the coating layer 120 made of oxide may have high temperature resistance and high hardness and also may have physical and chemical properties that are not deteriorated even at high temperatures of approximately 600° C. or more. Accordingly, the substrate 10 supported by the edge ring 100 and the edge ring 100 may be prevented from being bonded to each other at a high temperature, and an occurrence of scratch occurring on the substrate 10 and/or the edge ring 100 may be minimized. Also, the occurrence of the scratch of the substrate 10 and/or the edge ring 100 may be minimized to suppress or prevent the occurrence of the particles.

The thickness of the coating layer 120 may be selected in a range of approximately 400 nm to approximately 1,500 nm and may be selected in a range of approximately 400 nm to approximately 1,500 nm in accordance with process conditions. When the coating layer 120 has a thickness less than that of approximately 400 nm, the coating layer 120 may not properly function as a protective layer for reducing damage to the main body 110 and may not provide sufficient mechanical stiffness of the edge ring 100. Also, since the main body 110 is not sufficiently coated, the edge ring 100 may not have strong resistance to the contamination and particles.

On the other hand, when the coating layer 120 has a thickness greater than that of approximately 1,500 nm, the edge ring 100 may have sufficient mechanical stiffness. However, the overall thickness of the edge ring 100 may increase to allow a position of the upper surface to be higher as a whole, and the laminar flow of the process gas may not be effectively formed. Also, it may be difficult to bond the rotation support part 250 to the support ring 251 due to the thick thickness of the edge ring 100 and to allow the edge ring 100 to rotate, and also, the groove (or the space) of the groove part 114 may be reduced in volume. Also, since the thermal conductivity of the edge ring 100 increases significantly so that the temperature of the heated edge ring 100 is transferred to the edge region of the substrate 10, the temperature of the edge region of the substrate 10 may be greater even than that of the central region of the substrate 10. Since it takes a lot of time to increase in thickness of the coating layer 120 while coating the coating layer 120 on the main body 110 (that is, a deposition rate or coating rate of the coating layer decreases), when the coating layer 120 has a thickness greater than approximately 1,500 nm, an unnecessary time may increase while manufacturing the edge ring 100. Also, unnecessary costs are generated due to the unnecessary coating time.

The main body 110 may include elements constituting the substrate 10, and the coating layer 120 may be made of oxide of the elements constituting he substrate 10. For example, the main body 110 may be made of silicon carbide (SiC), and the coating layer 120 may be a silicon oxide film (SiOx). The main body 110 may include the elements constituting the substrate 10 and thus be made of a material having heat capacity similar to that of the substrate 10. When the substrate 10 is a silicon (Si) substrate, the main body 110 may be made of silicon carbide (SiC) to process the Si substrate. Here, the main body 110 may be formed by sintering a powder material and then mechanically processing the sintered powder material.

When the coating layer 120 is the Si substrate 10, the coating layer 120 may be a silicon oxide film (SiOx) made of Si oxide. Also, since the main body 110 that is transparent to radiation in a frequency range used to measure the temperature of the substrate 10 and is capable of transmitting scattered radiant heat, which may affect the temperature measurement, is coated, the edge ring 100 may be manufactured to be opaque with respect to the radiant heat. Also, the main body 10 made of the silicon carbide (SiC) may have fine gap(s) on the surface thereof due to characteristics of the material, and the particles due to the mechanical processing may remain on the surface of the main body 10. In this case, when the remaining material is caught in the fine gap(s) during the process, the remaining material may not be exhausted to the exhaust part 240 but be introduced together with the process gas to act as particles, and the particles remaining on the surface of the main body 110 due to the mechanical processing may be introduced onto the substrate 10 together with the process gas.

However, when the main body 110 made of the silicon carbide (SiC) is coated with the coating layer 120, the fine gap(s) may be filled to effectively exhaust the remaining material through the exhaust part 240, thereby preventing or suppressing the action as the particles due to the remaining material remaining on the surface of the edge ring 100, and also, the particles remaining on the surface of the main body 110 due to the mechanical processing may be coated together to prevent the particles remaining on the surface of the main body 110 due to the mechanical processing from being introduced onto the substrate 10 together with the process gas during the process. Also, the coating layer 120 is formed using the silicon oxide film (SiOx) made of the Si oxide, the coating layer 120 may be easily formed only by oxidizing silicon (Si) provided on the surface of the main body 110, and the coating layer 120 may share the same element (i.e., the silicon element) as the main body 110 to improve the bonding of the main body 110 and the coating layer 120.

When the coating layer 120 has a thickness less than that of approximately 400 nm, since the particles remaining on the surface of the main body 110 due to the mechanical processing are not completely coated, the coating layer 120 may be formed with a thickness selected in a range of approximately 400 nm to approximately 1,500 nm so as to completely coating (or applying) the particles, which remain on the surface of the main body due to the mechanical processing.

Figure 4:
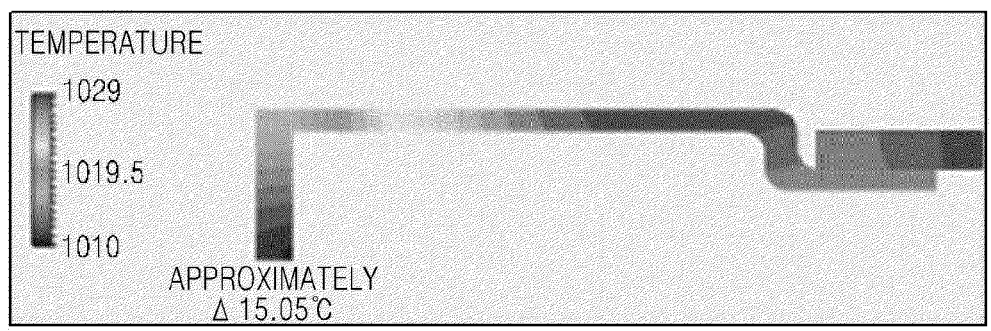
FIG. 4 is a view for explaining temperature uniformity improvement of a substrate by the edge ring in accordance with an exemplary embodiment.
Figure 4:
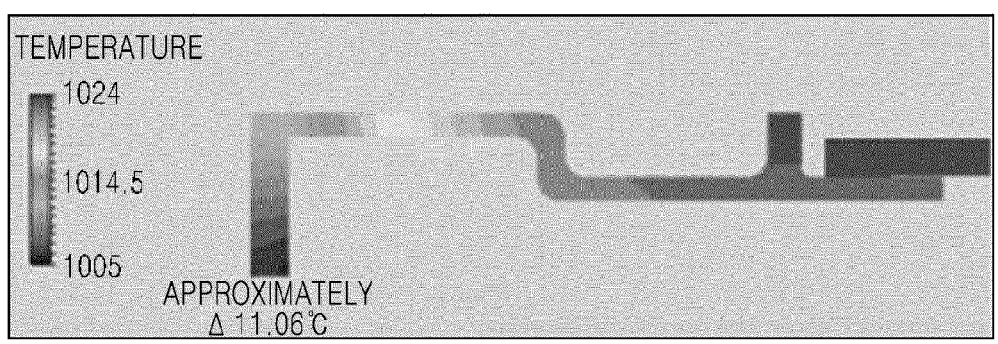
Figure 4:
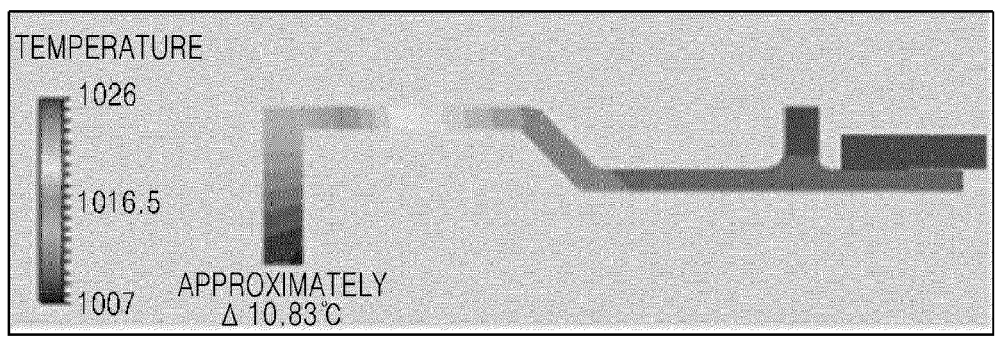

FIG. 4 is a view for explaining the temperature uniformity improvement of the substrate by the edge ring in accordance with an exemplary embodiment. Here, (a) of FIG. 4 illustrates an edge ring in accordance with the related art, (b) of FIG. 4 illustrates an edge ring having a vertical connection sidewall, and (c) of FIG. 4 illustrates an edge ring having an inclined connection sidewall.

Referring to FIG. 4, in the edge ring in accordance with the related art, which has no groove part 114, a temperature of an edge region of a substrate 10 is not uniform as illustrated in (a) of FIG. 4. However, as illustrated in (b) of FIG. 4 and (c) of FIG. 4, if the groove part 114 is provided, the temperature of the edge region may be uniform.

Thus, the edge ring 100 in accordance with an exemplary embodiment may induce the flow of the process through the groove part 114 so that the process gas flows to the substrate 10 after being sufficiently heated in the groove part 114 to prevent the temperature of the edge region of the substrate 10 from being relatively lowered by the process gas, thereby allowing the temperature of the edge region of the substrate 10 to be uniform. Accordingly, a temperature deviation between the central region and the edge region of the substrate 10 may be minimized to improve temperature uniformity of the substrate 10. Therefore, the twisting and/or warpage of the substrate 10 may be prevented to improve the yield of the product.

Figure 5:
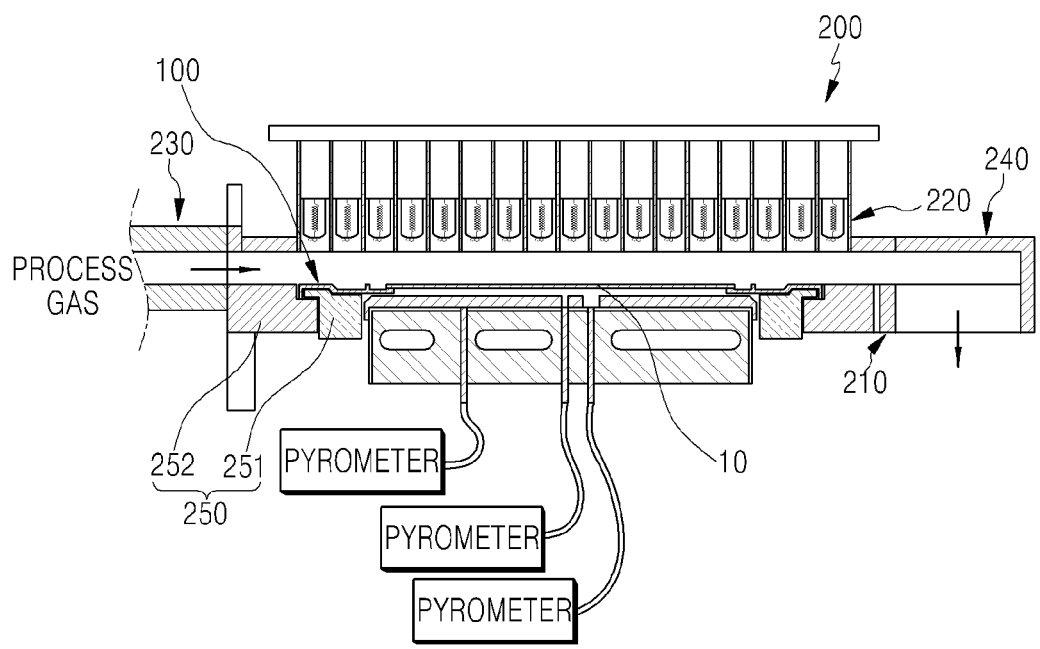
FIG. 5 is a view illustrating a heat treatment apparatus in accordance with another exemplary embodiment.

FIG. 5 is a view illustrating a heat treatment apparatus in accordance with another exemplary embodiment.

A heat treatment apparatus in accordance with another exemplary embodiment will be described with reference to FIG. 5. In descriptions of an edge ring in accordance with another exemplary embodiment, which are duplicated with respect to the edge ring in accordance with the foregoing embodiment, will be omitted.

A heat treatment apparatus 200 in accordance with another exemplary embodiment may include a chamber 210 having an inner space in which a heat treatment process is performed, an edge ring 100 in accordance with an exemplary embodiment, which is provided in the inner space of the chamber 210, a heating source 220 disposed above the edge ring 100 to provide heat energy toward the substrate 10 supported by the edge ring 100, a gas supply part 230 provided at one side of the chamber 210 to supply a process gas, and an exhaust part 240 provided at the other side of the chamber 210 to face the gas supply part 230, thereby exhausting a remaining gas in the chamber 210.

The chamber 210 may have the inner space in which the heat treatment process is performed, define a treating space, and form a process atmosphere. For example, a window made of quartz may be provided in a top surface of the chamber 210, and the heating source 220 may be disposed on the window.

The edge ring 100 may provide the inner space of the chamber 210 to support a substrate 10 within the chamber 210. The edge ring 100 may be the edge ring in accordance with an exemplary embodiment and have a groove part 114 to prevent a temperature of the edge region of the substrate 10 from being lowered by the process gas, thereby allow the temperature of the edge region of the substrate 10 to be uniform.

The heating source 220 may be disposed above the edge ring 100 to provide the heat energy toward the substrate 10 supported by the edge ring 100. Here, the heating source 220 may provide radiant energy to the inner space of the chamber 210 and transfer the radiant energy to the substrate 10 to heat the substrate.

For example, the heating source 220 may include a plurality of lamps provided above the edge ring 100. Each of the plurality of lamps may include a halogen lamp and may generate radiant heat introduced into the inner space of the chamber 210 through the window of the chamber 210. Also, the plurality of lamps may be arranged in a plurality of regions, which are classified together into several control groups, and the lamps may be controlled through a temperature control algorithm to control the temperature of the substrate 10.

The gas supply part 230 may be provided at one side of the chamber 210 to supply the process gas. Here, the gas supply part 230 may supply the process gas having a temperature less than a temperature in the heat treatment process. That is, the gas supply part 230 may supply the process gas into the inner space (a space between the window of the chamber and the substrate) of the chamber 210 while the heat treatment process is performed. A remaining gas that does not react to remain on the substrate 10 after the process gas is supplied into the inner space of the chamber 210 may be exhausted (or discharged) through an exhaust part 240.

The exhaust part 240 may be provided at the other side of the chamber 210 to face the gas supply part 230, thereby exhausting the remaining gas within the chamber 210. Here, an exhaust hole of the exhaust part 240 may be defined to face an injection hole of the gas supply part 230. A linear gas flow may be formed by the injection hole of the gas supply part 230 and the exhaust hole of the exhaust part 240. For example, the remaining gas within the chamber 210 may be exhausted by passing through the exhaust hole of the exhaust part 240 through a discharge port connected to a vacuum pump (not shown).

Here, a top surface of an outer band 112, an upper end (surface) of an inner sidewall 114b, and a top surface of the substrate 10 may be disposed at the same height to respectively provide substantially flat top surfaces (or surfaces). The injection hole of the gas supply part 230 and the exhaust hole of the exhaust hole 240 may be provided in an extension line of the flat top surface(s) (i.e., a line crossing the top surface of the outer band, the upper end surface of the inner sidewall, and the top surface of the substrate) to face each other. Accordingly, a gentle flow of the process gas crossing the flat top surface(s) may be allowable, and a laminar flow may be formed on the substrate 10.

The heat treatment apparatus 200 in accordance with another exemplary embodiment may be a rapid thermal processing (RTP) apparatus.

The heating source 220 may have an area greater than that of the substrate 10, and at least a portion of the heating source 220 may be provided above the groove part 114 of the edge ring 100 to provide heat energy toward the groove part 114. In another exemplary embodiment, since the process gas introduced into the groove part 114 has to be heated, the heating source 220 may be provided above the edge ring 100 as well as the substrate on which the heat treatment is directly performed. For this, the heating source 220 may have an area greater than that of the substrate 10 and provided above the edge ring 100. Here, the heating source 220 may be provided above at least the groove part 114 of the edge ring 100, and thus, the process gas introduced into the groove part 114 may be effectively heated. Therefore, it is possible to prevent the temperature of the edge region of the substrate 10 from being lowered by the process gas that is not sufficiently heated. For example, the lamp may be disposed above the groove part 114 of the edge ring 100. Here, the lamp(s) disposed above the groove part 114 among the plurality of lamps may be grouped together.

The heat treatment apparatus 200 in accordance with another exemplary embodiment may further include a rotation support part 250 rotating the edge ring 100, and the rotation support part 250 may include a support ring 251 on which the edge ring 100 is supported.

The rotation support part 250 may include a support ring 251, on which the edge ring 100 is supported, to allow the supported edge ring 100 to rotate. The support ring 251 may support the edge ring 100 and have a ring shape or cylinder shape. The edge ring 100 may be supported to surround the support ring 251. For example, the support ring 251 may be made of quartz, and silicon may be coated (or applied) as a shield blocking radiation from the heating source 220, which may interfere with the temperature measurement of the substrate 10. Thus, the supporting ring 251 may be opaque in a range of a frequency of a pyrometer.

The rotation support part 250 may rotate the supported edge ring 100 so that the substrate 10 rotates. Also, the rotation support part 250 may allow the edge ring 100 and/or the substrate 10 to ascend (or vertically move). For example, the rotation support part 250 may allow the substrate 10 to rotate while the heat treatment process is performed. Here, the substrate 10 may rotate at a rate of approximately 90 times per minute, and the support ring 251 coupled to a driving system (not shown) may rotate to allow the edge ring 100 to rotate. Here, the rotation support part 250 may further include a base plate 252 supporting the support ring 251, and the driving system (not shown) may be provided on the base plate 252.

The process gas may be provided in parallel to the top surface of the substrate 10. The process gas may not be supplied perpendicular to the top surface of the substrate 10 toward the top surface of the substrate 10 but be supplied parallel to the top surface of the substrate 10 in a lateral direction (or from a side surface) of the substrate 10. As a result, a laminar flow may be formed on the substrate 10. That is, the process may flow in parallel to the top surface of the substrate 10 along the substantially flat top surface, which is defined by the top surface of the outer band 112, the upper end (surface) of the inner sidewall 114b, and the top surface of the substrate 10, and the remaining gas may be disposed through the exhaust part 240 after reacting on the substrate 10. As a result, the laminar flow may be formed on the substrate through the flow of the gas.

Also, the groove part 114 may be provided symmetrically with respect to a central axis of the edge ring 100. The process gas may be supplied from one side of the substrate 10 to cross the top surface of the substrate 10 in parallel to the top surface of the substrate 10. However, since the edge ring 100 rotates while the heat treatment process is performed, the groove part 114 for the uniform heat treatment on the substrate 10 may be disposed symmetrical to the central axis of the edge ring 100. For example, the groove part 114 may be defined along a circumference of the substrate support part 111 of the edge ring, and a groove having a ring shape may be defined in the main body 110. In this case, even though the edge ring 100 rotates, since the groove part 114 is provided in a direction in which the process gas is supplied, air that is sufficiently heated in the groove part 114 may be transferred to the substrate 10. Thus, even when the substrate 10 rotates, the uniform heat treatment may be performed on the substrate 10.

In the heat treatment apparatus 200 in accordance with another exemplary embodiment, a structural shape may be optimized with an area that directly contacts the substrate 10 through a change in shape. Also, a coating layer 120 may be provided on the surface of the main body 110 to improve mechanical stiffness and thermal conductivity of the edge ring 100. Also, thermal deformation and chemical damage of the edge ring 100 may be reduced, strong resistance to contamination and particles may be provided. Also, the process gas may be introduced into the groove part 114 of the edge ring 100 and be heated to secure a process gas flow that is matched with an atmosphere environment. Thus, a temperature deviation of the substrate 10 may be minimized, and a thermal loss due to the matching of the atmosphere environment may be minimized.

As described above, the flow of the process gas may be induced through a groove part so that the process gas is heated in the groove part to flow to the substrate, thereby preventing the temperature of the edge region of the substrate from being relatively lowered by the process gas, thereby minimizing the temperature deviation between the central region and the edge region of the substrate and improving the temperature uniformity of the substrate. Therefore, the twisting and/or warpage of the substrate may be prevented to improve the yield of the product. In addition, the coating layer such as the oxide film may be formed on the edge ring to increase in mechanical stiffness and the thermal conductivity, reduce the thermal deformation and the chemical damage, and have the strong resistance to the contamination and the particles. Also, the heating source may be provided above the groove part to effectively heat the process gas introduced into the groove part.

The term "~ on" used in the above description includes direct contact and indirect contact at a position that is opposite to an upper and lower portion. It is also possible to locate not only the entire upper surface or the entire lower surface but also the partial upper surface or the lower surface, and it is used in the mean that it is opposed in position or contact directly to upper or lower surface.

The edge ring in accordance with the exemplary embodiment may induce the flow of the process gas through a groove part so that the process gas is heated in the groove part to flow to the substrate, thereby preventing the temperature of the edge region of the substrate from being relatively lowered by the process gas, thereby minimizing the temperature deviation between the central region and the edge region of the substrate and improving the temperature uniformity of the substrate. Therefore, the twisting and/or warpage of the substrate may be prevented to improve the yield of the product.

In addition, the coating layer such as the oxide film may be formed on the edge ring to increase in mechanical stiffness and the thermal conductivity, reduce the thermal deformation and the chemical damage, and have the strong resistance to the contamination and the particles.

Also, the heat treatment apparatus in accordance with the exemplary embodiment may provide the heating source above the groove part to effectively heat the process gas introduced into the groove part.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present inventive concept shall be determined by the technical scope of the accompanying claims.

What is claimed is:
1. An edge ring, comprising:
a main body having a ring shape,
wherein the main body comprises:
 a substrate support part configured to support an edge of a bottom surface of a substrate;
 an outer band provided outside the substrate support part, and having a top surface that is higher than a top surface of the substrate support part and is parallel to a top surface of the substrate supported by the substrate support part;

an outer sidewall provided outside the outer band; and a groove part provided between the substrate support part and the outer band, wherein the groove part comprises:

a bottom plate provided at a height that is lower than the outer band;

an inner sidewall protruding from a top surface of the bottom plate; and a connection sidewall configured to connect the outer band to the bottom plate, wherein an upper end of the inner sidewall has the same height as the top surface of the substrate supported by the substrate support part or has a height higher than the top surface of the substrate, and wherein the bottom plate is provided at a height equal to or less than that of the substrate support part.

2. The edge ring of claim 1, wherein the connection sidewall has an inner surface configured to connect the top surface of the outer band to the top surface of the bottom plate, and the inner surface at least partially has a section in which the inner surface approaches the inner sidewall as a height of the inner surface is lowered.

3. The edge ring of claim 1, further comprising a coating layer made of oxide of any one of elements constituting the main body and coated on at least a portion of the main body.

4. The edge ring of claim 3, wherein the coating layer has a thickness that is selected in a range of 400 nm to 1,500 nm.

5. A heat treatment apparatus comprising:

a chamber having an inner space in which a heat treatment process is performed;

an edge ring of claim 1, which is provided in the inner space of the chamber;

a heating source disposed above the edge ring to provide heat energy toward the substrate supported by the edge ring;

a gas supply part provided at one side of the chamber to supply a process gas; and an exhaust part provided at the other side of the chamber to face the gas supply part, thereby exhausting a remaining gas within the chamber.

6. The heat treatment apparatus of claim 5, wherein the heating source has an area greater than that of the substrate, and at least a portion of the heating source is provided above the groove part of the edge ring to provide heat energy toward the groove part.

7. The heat treatment apparatus of claim 5, further comprising a rotation support part rotating the edge ring, and the rotation support part comprises a support ring on which the edge ring is supported.

* * * * *